United States Patent [19]

Feiber et al.

[11] Patent Number: 4,599,026

[45] Date of Patent: Jul. 8, 1986

[54] APPARATUS FOR PROVIDING A CONTINUOUS SUPPLY OF WORKPIECES

[75] Inventors: Wolfgang E. A. Feiber, Harrisburg; Ronald J. Capp, Enola; Dwight A. Griffin, Harrisburg, all of Pa.

[73] Assignee: AMP Incorporated, Harrisburg, Pa.

[21] Appl. No.: 705,597

[22] Filed: Feb. 26, 1985

[51] Int. Cl.⁴ ............................................. H05K 13/02
[52] U.S. Cl. ....................................... 414/126; 29/809; 221/11; 221/103; 221/197; 414/330; 414/413; 414/414; 414/421
[58] Field of Search ................. 414/32, 112, 125, 126, 414/127, 330, 403, 413, 419, 421, 414; 221/11, 103, 104, 105, 106, 197, 198; 29/741, 809

[56] References Cited

U.S. PATENT DOCUMENTS

| | | | |
|---|---|---|---|
| 2,453,077 | 11/1948 | Newton | 414/127 X |
| 3,291,338 | 12/1966 | Gleason | 221/11 |
| 3,308,977 | 3/1967 | Cochran et al. | 414/32 X |
| 3,332,560 | 7/1967 | Niepmann | 414/414 X |
| 3,625,384 | 12/1971 | Boerger et al. | 414/413 |
| 4,351,108 | 9/1982 | Johnson | 29/741 |
| 4,401,234 | 8/1983 | Droira et al. | 221/103 X |

*Primary Examiner*—Leslie J. Paperner
*Attorney, Agent, or Firm*—F. Brice Faller

[57] ABSTRACT

Apparatus for providing a continuous supply of workpieces to a pickup station comprises a frame having a magazine in the top thereof, the workpieces being packaged in open-ended trays stacked in the magazine. A pickup plate assembly pivots downward from a position paralleling the bottom of the magazine, where it picks up a tray, to an inclined delivery position aligned with the inclined surface of a delivery station. Holding means are released so the connectors slide from the open end of the tray until it is empty. Thereafter the pickup plate pivots further downward and the empty tray is ejected.

9 Claims, 14 Drawing Figures

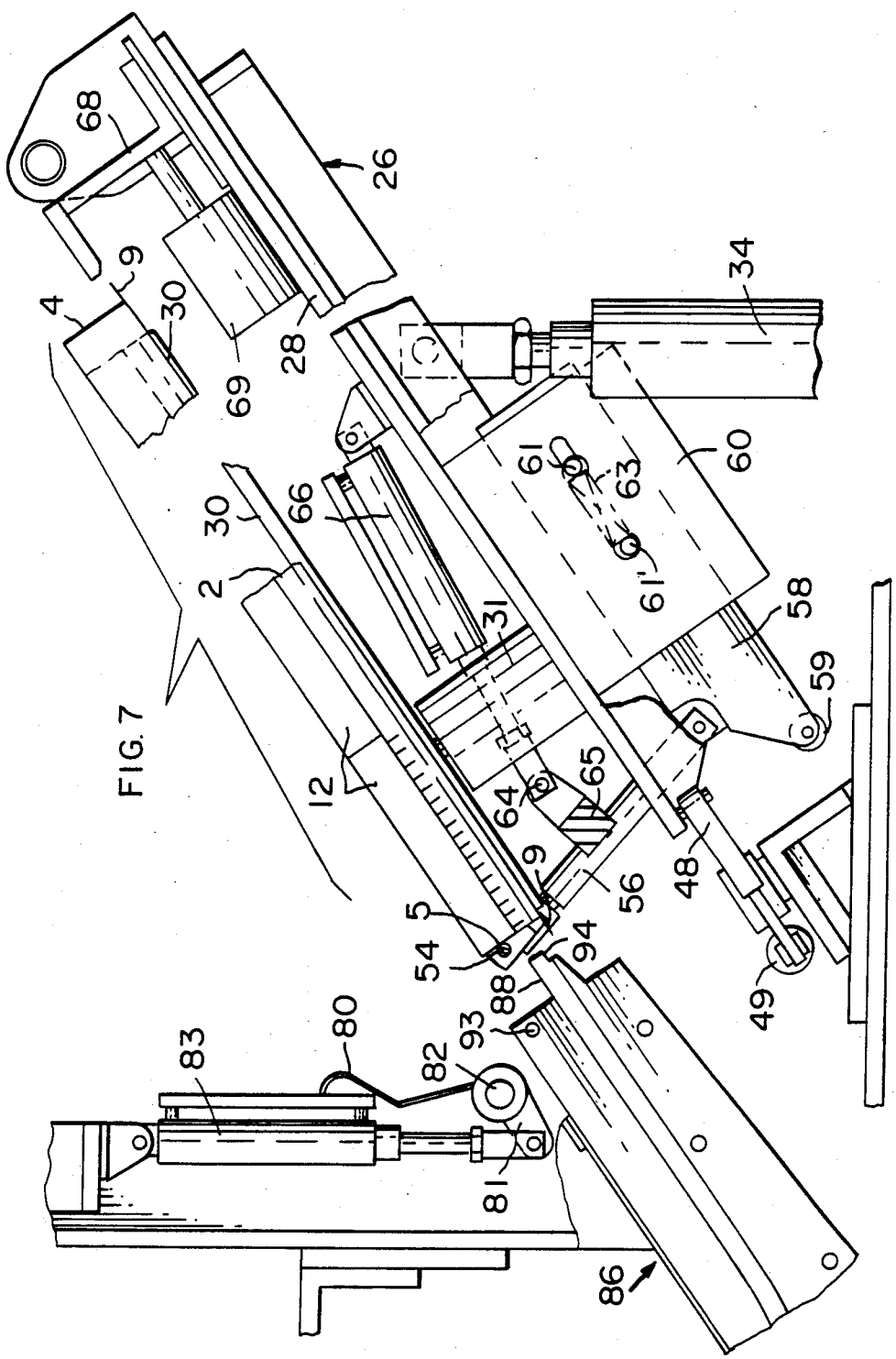

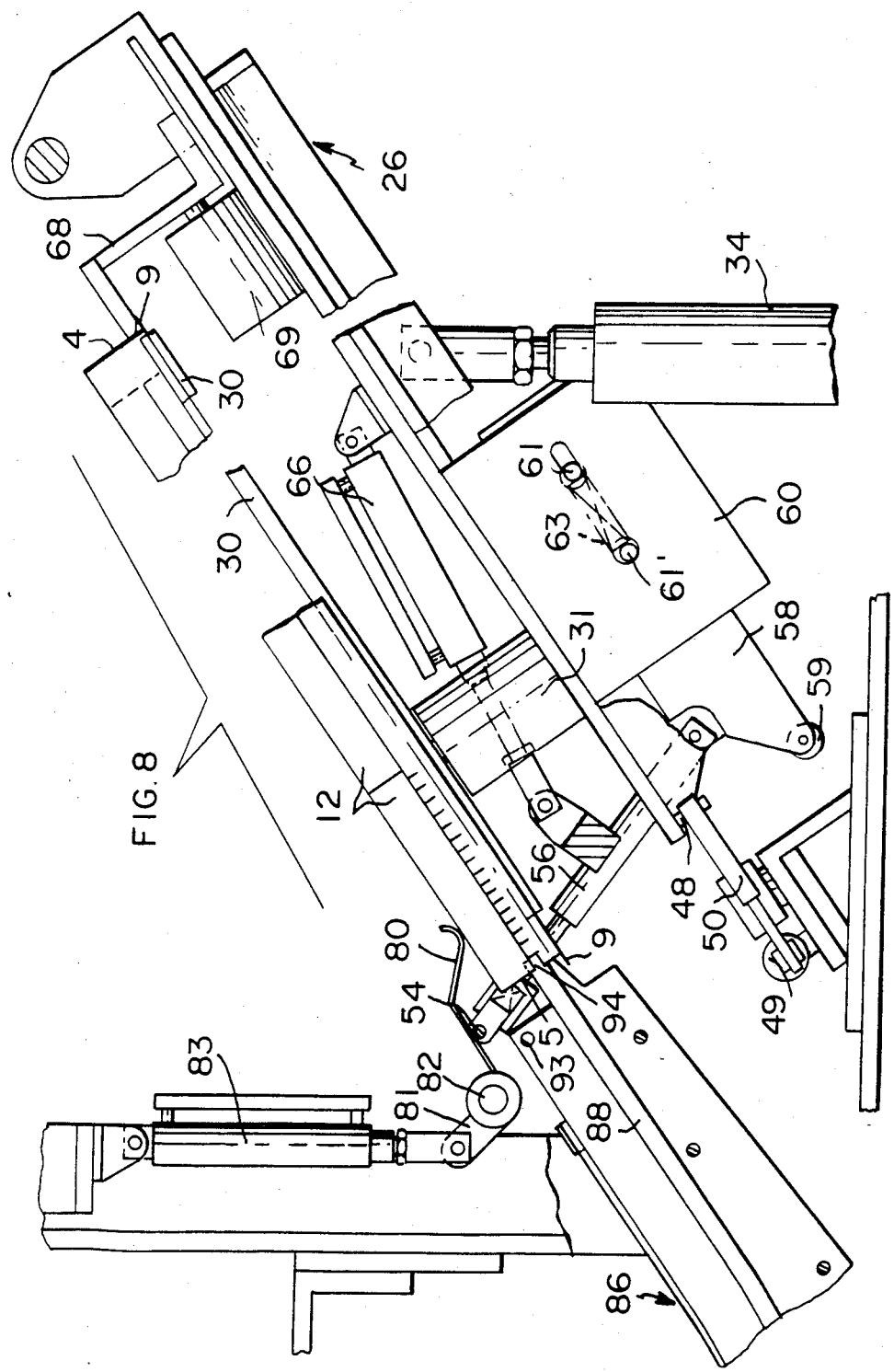

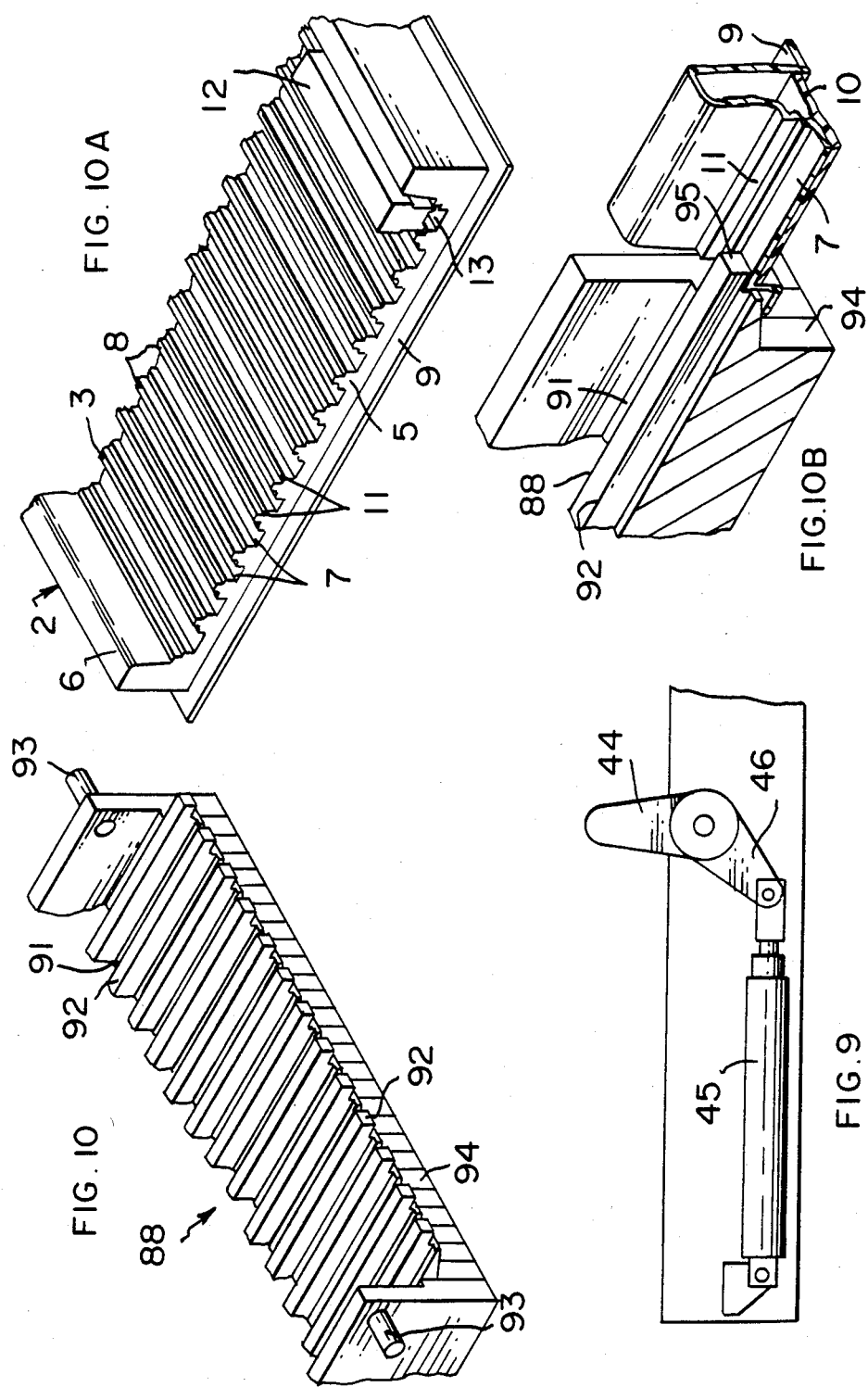

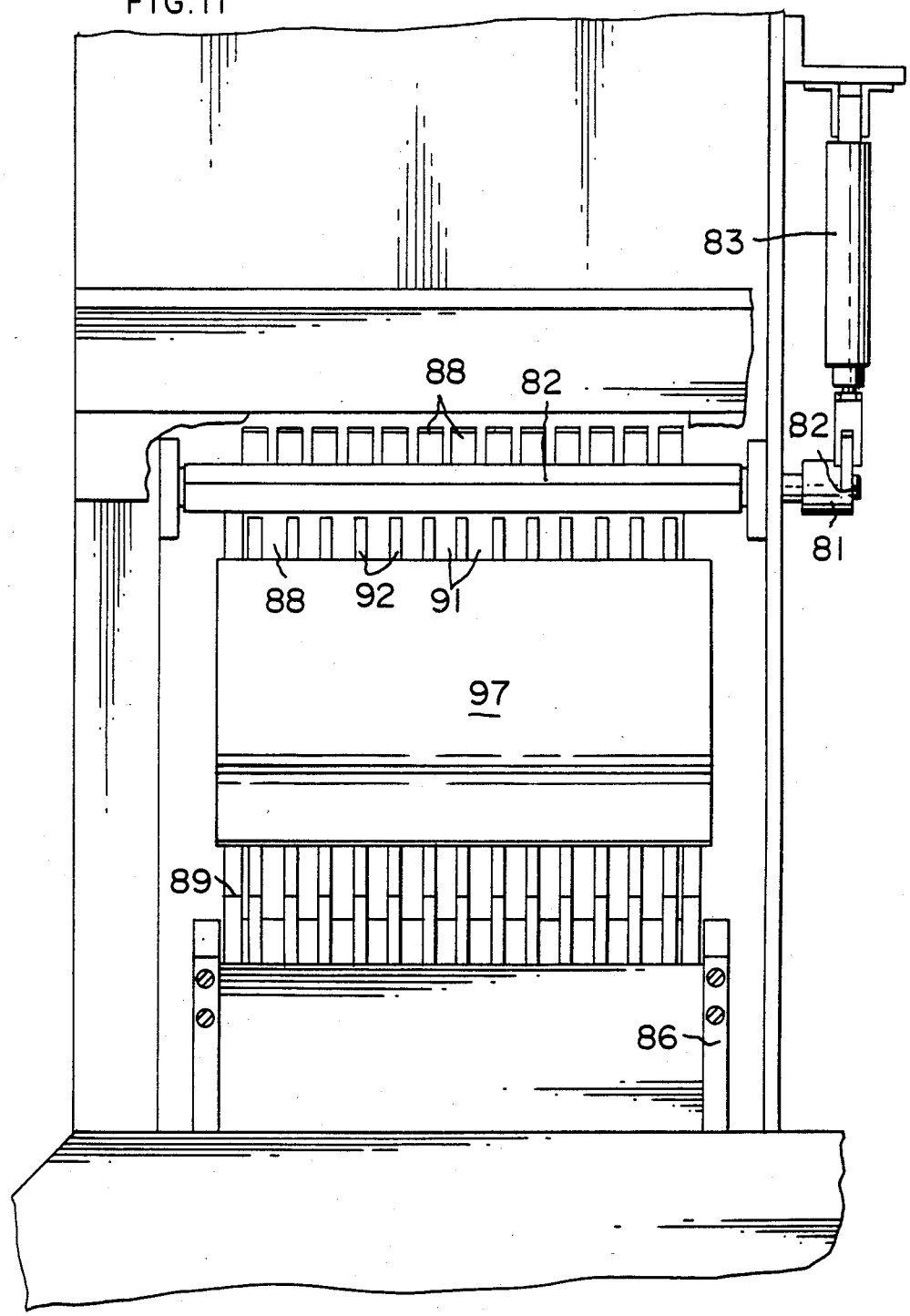

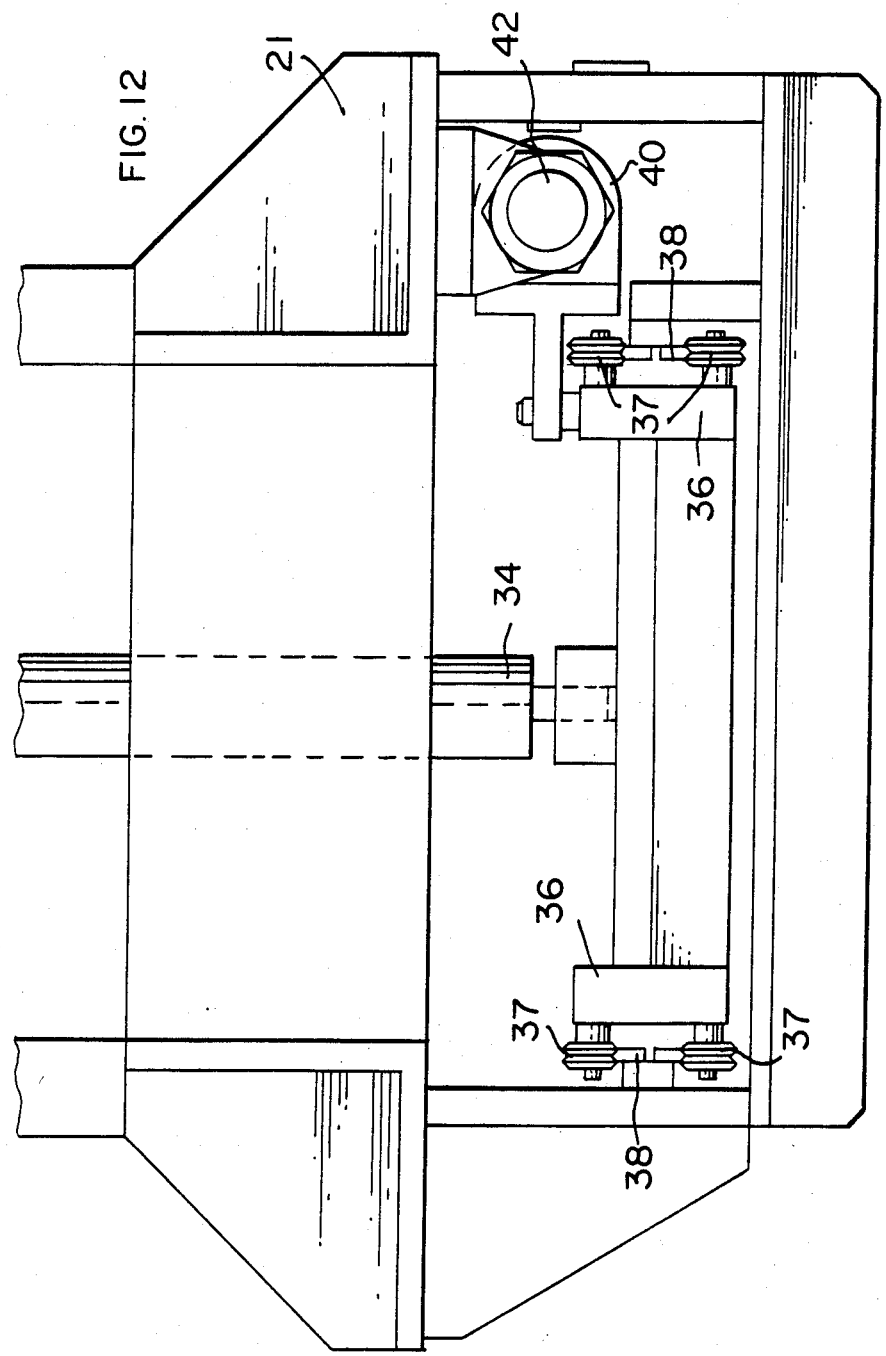

APPARATUS FOR PROVIDING A CONTINUOUS SUPPLY OF WORKPIECES

BACKGROUND OF THE INVENTION

The present invention relates to apparatus which supplies workpieces to a pickup point, and more particularly to a delivery system for electrical connectors packaged in trays.

The high speeds of automated assembly equipment appearing throughout industry often require that a continuous supply of workpieces be supplied to a pickup point. In the manufacture of computers, for example, a robot may be employed to pick up card edge connectors and place them on a large printed circuit board or mother board. The card edge connectors so emplaced receive the edges of smaller circuit boards called daughter boards or cards. Conventional delivery systems employ a single column magazine with an escapement which delivers one connector at a time to a pickup point. Such magazines generally hold a few dozen connectors and must be refilled frequently, requiring nearly constant attendance by an operator.

SUMMARY OF THE INVENTION

The apparatus of the present invention can be loaded with over a thousand electrical connectors packaged in trays and supply same continuously to a delivery station where they are picked up by a robot. Each tray has a top surface bounded by a first end and an opposed open second end. The connectors lie in side-by-side rows in channels on the top surface, the connectors being aligned end-to-end in each row. When a tray is tilted with the first end upward, connectors slide from the channels out the second end. Each tray also has a recessed bottom surface so that it can rest over the tray below, closing the second end thereof to prevent accidental dumping of the connectors. Connectors are thus conveniently packaged in stacks of trays in cartons.

The apparatus comprises a frame having a magazine in the top thereof where trays are stacked. A pickup plate pivoted in one end of the frame proximate the bottom of the magazine pivots from a generally horizontal pickup position paralleling the bottom of the magazine to an inclined delivery position where a tray carried by the pickup plate is substantially coplanar and contiguous with the inclined delivery surface of a delivery station. The inclined delivery surface has channels which cooperate with channels in the tray to receive the connectors when holding means associated with the pickup plate is released to allow gravity feed. An optical sensor detects when a tray in the delivery position is empty. The pickup plate then pivots further downward to dump the tray, then back to the pickup position to pick up another tray. Meanwhile, the delivery station holds enough connectors to supply the robot continuously.

Apparatus of the preferred embodiment is designed particularly to handle 13-row trays having six 32-point card edge connectors per row, the magazine holding 14 trays, for a total of 1,092 connectors. The apparatus can be adapted to handle other connectors used in the manufacture of computers, controllers or other instruments, as well as IC packages or like devices for robotic or other automatic insertion processes.

BRIEF DESCRIPTION OF THE DRAWINGS

FIG. 7 is an elevation of the pickup plate as it aligns with the delivery station.

FIG. 8 is an elevation of the pickup plate with a tray mated to the delivery station.

FIG. 9 is a plan view of a pickup plate stop.

FIG. 10 is a perspective of the leading edge of the delivery surface.

FIG. 10A is a perspective of the open end of a tray.

FIG. 10B is a perspective of a tray mated with the delivery surface.

FIG. 11 is an end view of the delivery station with connector end stop and sensor assembly removed.

FIG. 12 is an end view of the carriage which shifts to dump an empty tray.

DETAILED DESCRIPTION OF THE PREFERRED EMBODIMENT

Figure 1:
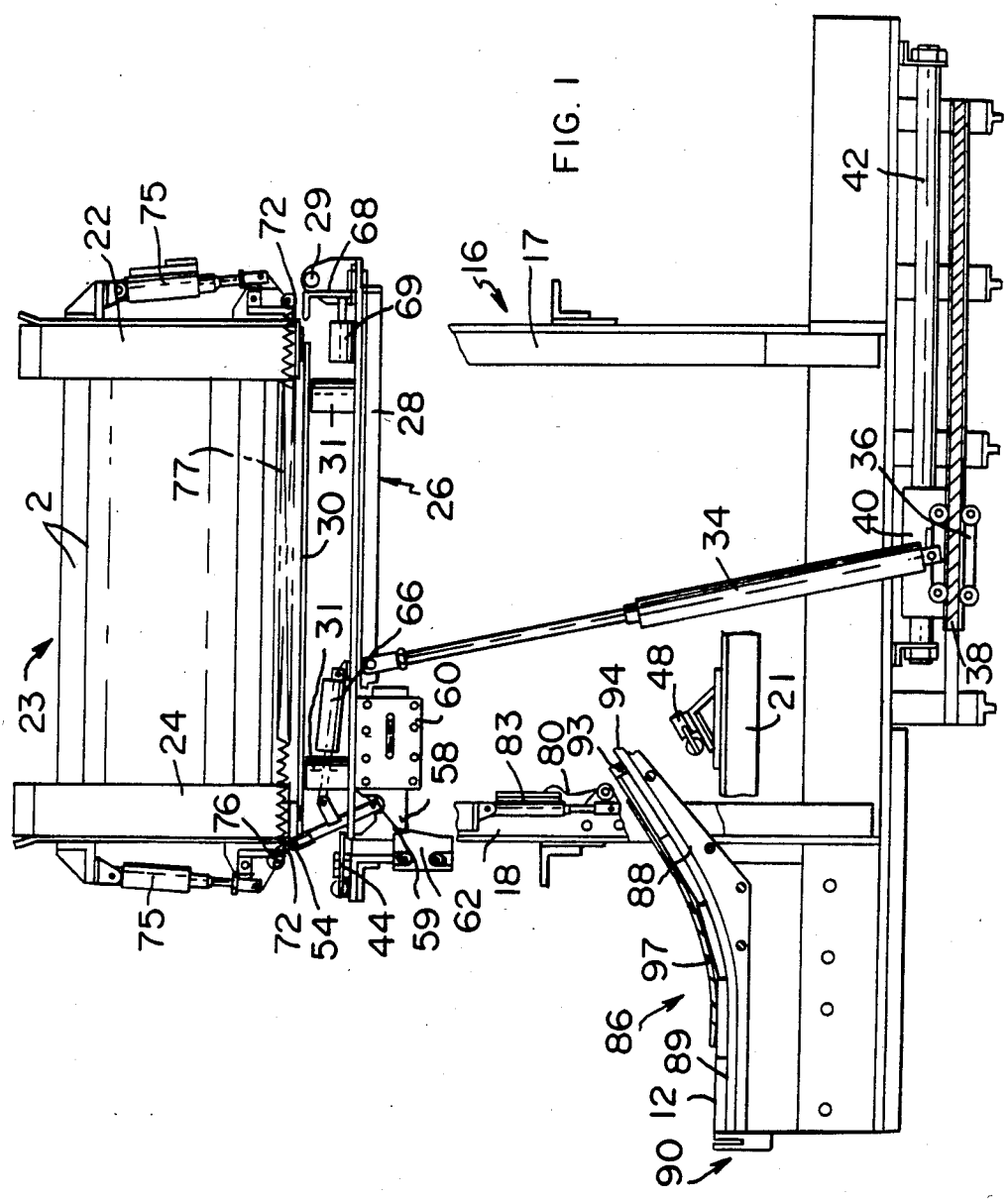
FIG. 1 is a side elevation of the apparatus in the pickup position.

Referring to FIG. 1, the apparatus comprises a frame 16, a generally rectangular structure having a first vertical end 17 and a second vertical end 18 with upper and lower cross members 20, 21 extending therebetween. The top of the frame 16 has a magazine 23 for connector trays 2, which are positioned between first and second pairs of corner blocks 22, 24 on the upper portion of first and second ends 17, 18 respectively. The pickup plate assembly 26, shown in the pickup position, comprises a base plate 28, which is pivoted on shaft 29 by air cylinder 34, and pickup plate 30. The pickup plate 30 moves upward relative to base plate 28 by four air cylinders 31 fixed thereto to receive an individual connector tray 2, which is released from magazine 23 by the pivoting release levers 72, actuated by air cylinders 75. Carriages 58 are shifted by cam blocks 62 and thereafter by extension of cylinder 66 to pivot holding bar 54 away from plate 30, which permits a tray 2 to drop. These movements will be discussed in greater detail at FIGS. 4 and 5.

Other salient features apparent in FIG. 1 are stop adjustable 44, which limits upward travel of plate 28, and adjustable stop 48, which limits travel at the delivery position. Spring fingers 80, pivoted by cylinder 83, are shown positioned to allow passage of assembly 26. The delivery station 86 comprises an inclined delivery surface 88 having a leading edge 94, the surface 88 curving smoothly into horizontal pickup surface 89; connectors 12 move by gravity from surface 88 to surface 89, and are contained by cover 97 and stops 90 at the lower end of surface 89. Stops 90 incorporate sensors to determine if a connector is in the end position in that particular row.

Figure 2:
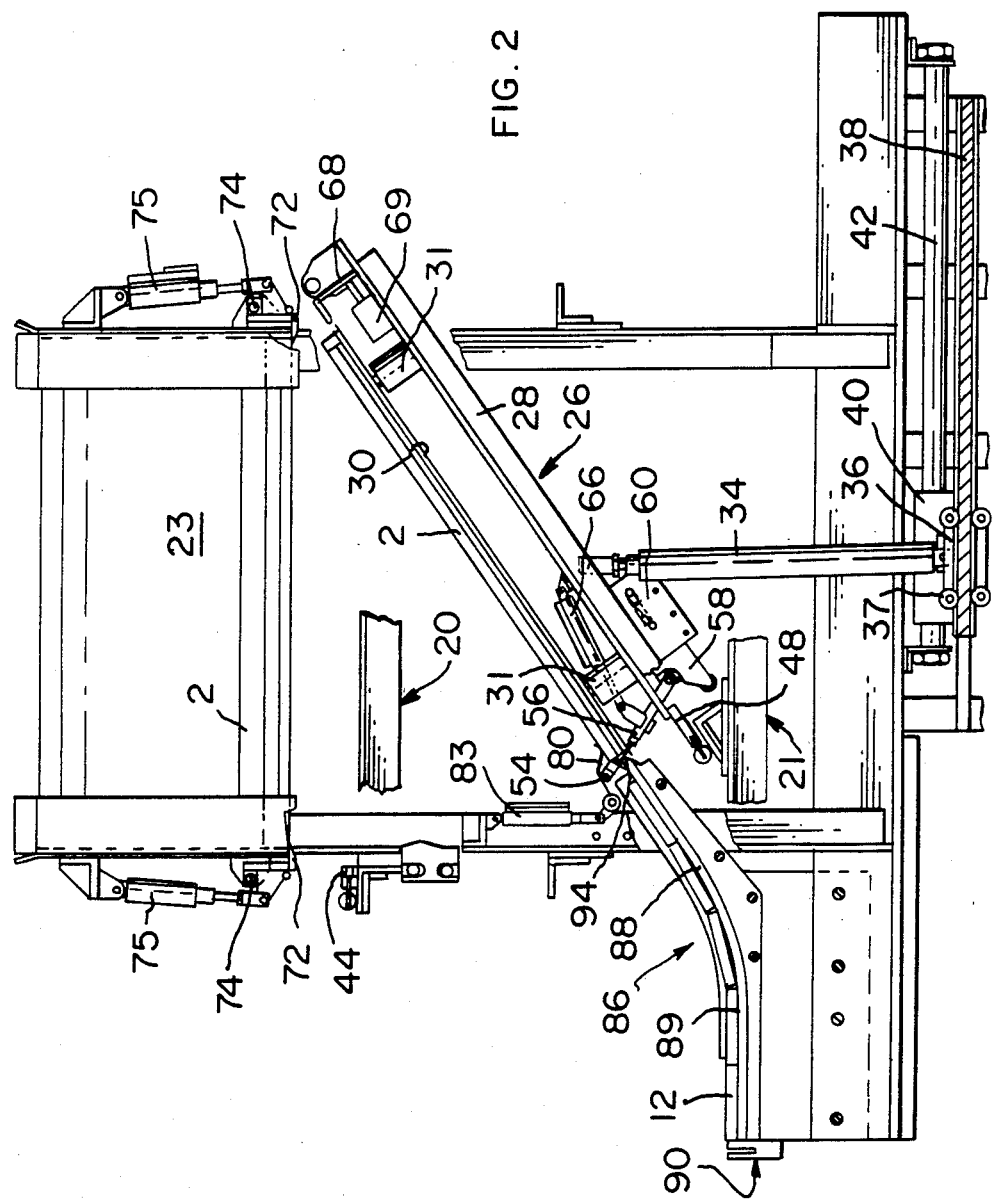
FIG. 2 is a side elevation of the apparatus in the delivery position.

Referring to FIG. 2, the pickup assembly 26 is shown in the delivery position, the base plate 28 having been pivoted downward by air cylinder 34, which is pivoted on carriage 36 at its lower end to allow limited rotation.

Stop 48 limits the movement of base plate 28 when a tray 2 is aligned with inclined surface 88 to permit downward sliding of tray 2 when pushed by loading bar 68, and thereafter spring fingers 80 are pivoted clockwise as shown in by cylinder 83. There is one spring finger 80 for each row of connectors in the tray 2, and the fingers 80 hold the connectors in place while holding bar 54 is moved upward from the lower end of the tray by cylinders 56 as shown. By rotating fingers 80 counterclockwise by cylinder 83, connectors will be released as will be discussed further at FIGS. 7 and 8.

Figure 3:
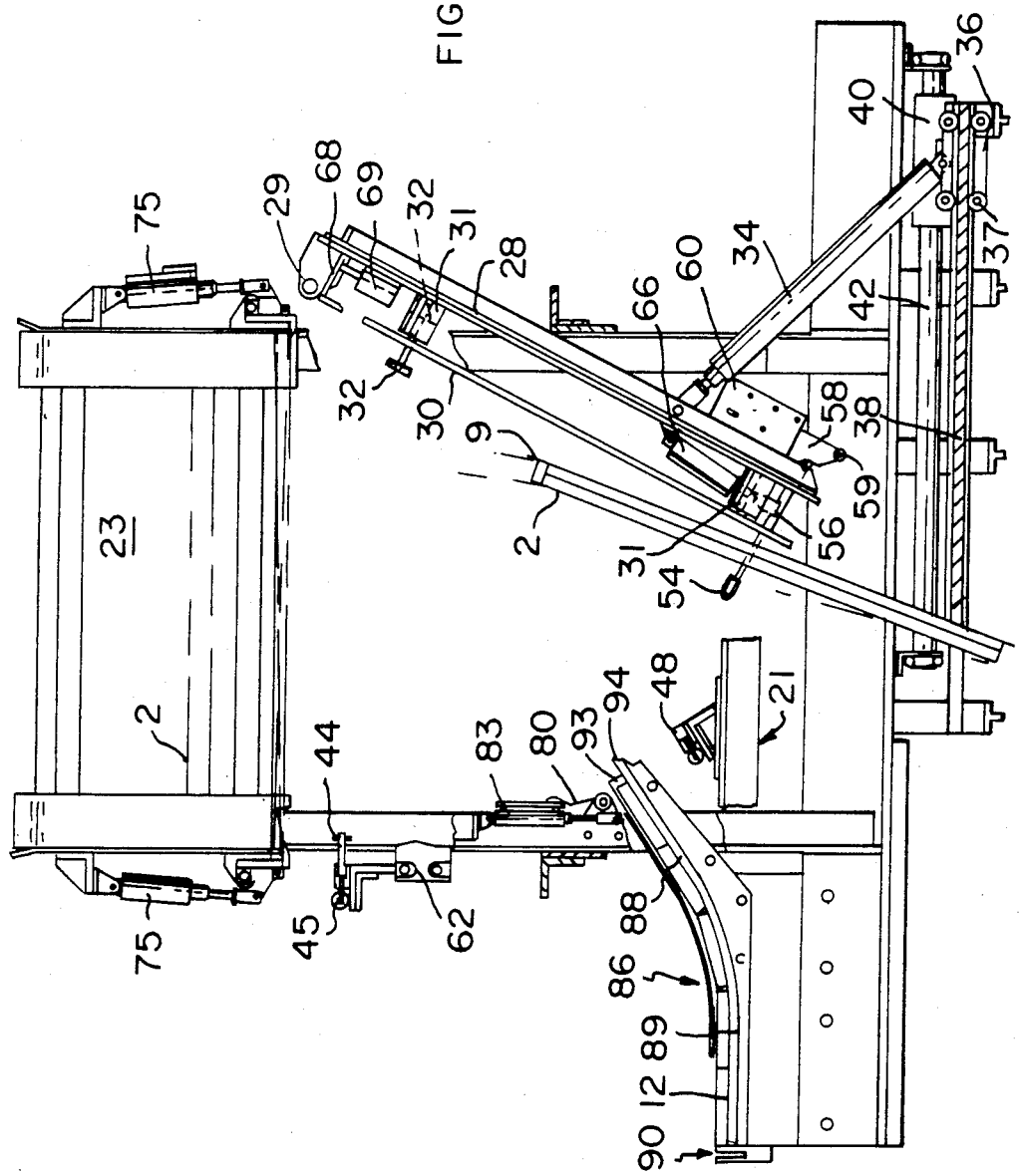
FIG. 3 is a side elevation of the apparatus in the dump position.

FIG. 3 shows the pickup plate assembly 26 in the dump position, where it has been pivoted by rightward movement of carriage 36, which rides on tracks 38 (see also FIG. 12). The carriage 36 is driven by yoke 40 on cylinder 42; the assembly 40, 42 is a "Rodless Cylinder" manufactured by Festo, and employs a piston sliding in closed cylinder 42, which piston is coupled by magnets to yoke 40. Cylinder movement is thus effected by air admitted in an end of cylinder 42. A tray 2 is shown falling from the assembly 26, where it has been ejected from pickup plate 30 by a pneumatic kicker 32 fixed to plate 30 (an aperture in plate 30 admits the kicker 32). Holding bar 54 is shown fully extended by pneumatic cylinders 56 to clear the ejected tray, and pivoted fully clockwise by cylinder 66 to clear leading edge 94 during downward and upward movements of assembly 26. After tray 2 has been fully discharged, and before raising the pickup plate assembly, holding bar 54 will be lowered by retracting piston rods of cylinders 56. Note that stop 48 has been pivoted out of the way to permit passage of assembly 26.

Figure 4:
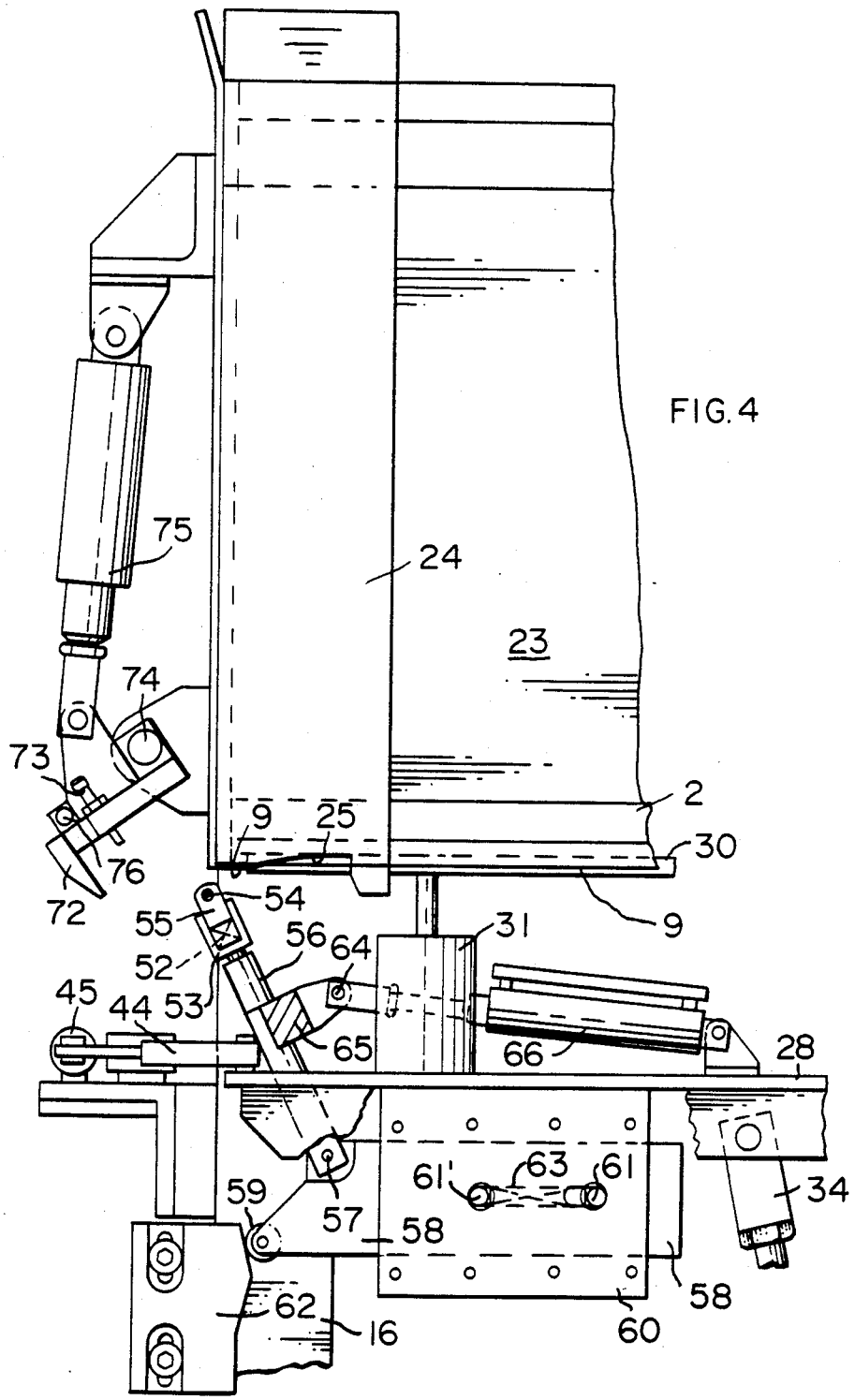
FIG. 4 is a partial elevation of the pickup plate receiving a tray released from the magazine.
Figure 5:
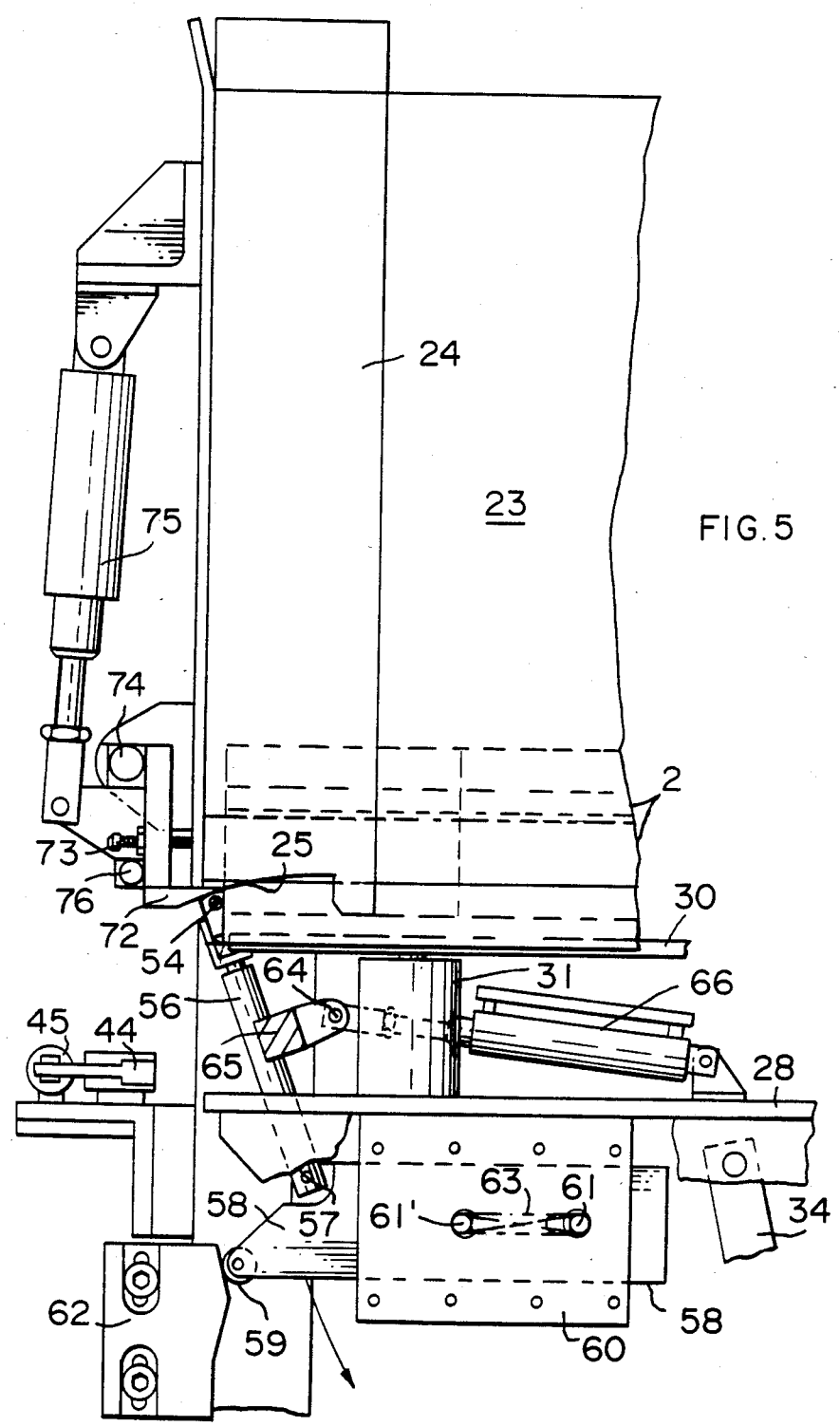
FIG. 5 is a side elevation of the pickup plate with a tray in place.

FIGS. 4 and 5 show the tray pickup sequence in detail. As the pickup assembly 26 moves upward, the holding bar 54 will remain under tracks 25. The sliding blocks 55 at both ends of holding bar 54 contact tracks 25 profiled in the lower ends of corner blocks 24, and spring 52 in U-fixtures 53 will compress to allow for the lower position of holding bar 54. Simultaneously, the followers 59 ride against cam blocks 62 fixed to frame 16. This moves pivots 57 rightward as carriages 58 ride rightward on gibs 60 which are fixed to base plate 28. This causes the cylinders 56 to rotate about pivot 64 to provide for extra distance required to clear the tray. Cylinder 66 is now extended to rotate cylinders 56 about pivots 57 to bring holding bar 54 into its final tray pickup position to the left of pickup plate 30, as shown in FIG. 4. The pickup plate 30 moves upward into the recessed bottom surface of the lowest tray 2 in magazine 23, lifting the entire stack of trays in the magazine. Release levers 72 then pivot outward from the magazine 23 so that the stack of trays 2 on plate 30 can be moved downward to the position shown in FIG. 5. Air cylinders 75 then pivot the release levers 72 inward to the position of FIG. 5, limited by adjustable stops 73, where they are situated under opposed ends of the next higher tray to prevent downward movement thereof. The upper stop 44 is then rotated by air cylinder 45, and downward movement of assembly 26 under action of cylinder 34 can commence. Springs 63 between pegs 61 on carriages 58 and pegs 61' on gib 60 will urge the carriages 58 leftward as followers 59 lose contact with cam blocks 62 and rotate cylinders 56 clockwise around pivot 64 and bring holding bar 54 into contact with the tray. After about two degrees to five degrees rotation of assembly 26, cylinder 66 is energized to pull holding bar 54 against the tray to counterbalance the weight.

Figure 6:
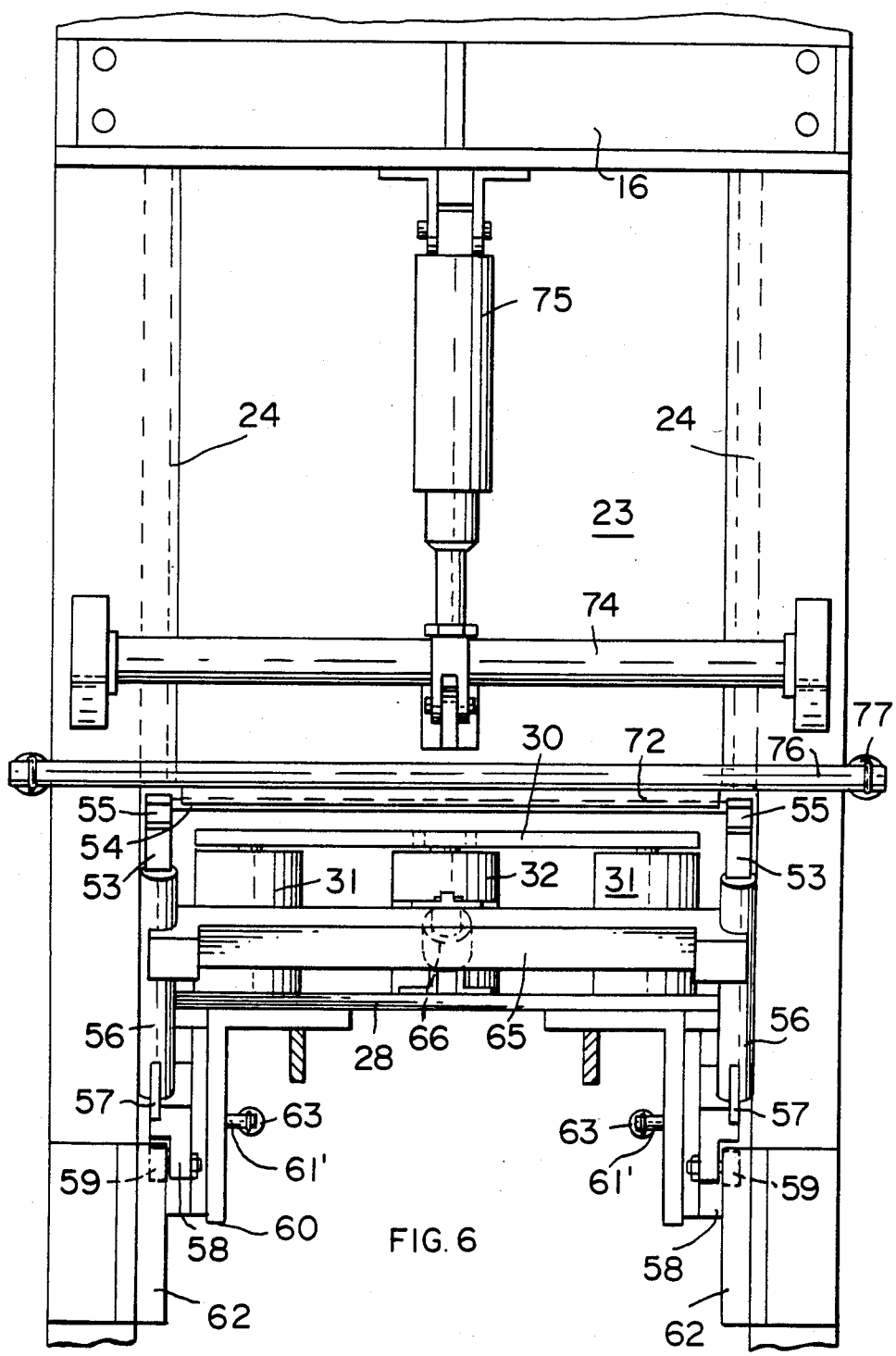
FIG. 6 is an end elevation of the pickup plate with tray holding mechanism.

FIG. 6 is an end view of the mechanisms operative when the pickup plate 30 is at the pickup position. Lever 72 substantially traverses the space between second corner blocks 24 to effectively hold one end of a stack of trays. The lever 72 is pivoted about shaft 74 under the action of pneumatic cylinder 75, which pivots it away from the magazine 23. Coil springs 77 looped on the ends of shaft 76, which is fixed to the lever 72, extend across the apparatus to opposite lever 72 and serve as a safety mechanism to return and hold levers 72 toward the magazine 23 in case air pressure in cylinders 75 should be accidentally lost. The holding bar 54 spans between the sliding blocks 55 in U-fixtures 53 on the ends of piston-driven rods extending from cylinders 56, which are braced by crossbar 65, which provides a pivot point 64 for lateral movement by cylinder 66 (see FIGS. 4 and 5). The cylinders 56 are pivoted to carriage 58 at their bottom ends 57 to permit shifting of ends 57 and therewith holding bar 54 when followers 59 ride up against cam blocks 62 as previously described. Springs 63 serve to urge the carriage 58 toward the viewer.

FIG. 7 is an elevation of the pickup plate assembly 26 when base plate 28 is lowered against stop 48 by the action of cylinder 34. The tray 2 situate on pickup plate 20 is aligned to deliver connectors 12 onto inclined delivery surface 88 of the delivery station 86. Holding bar 54 remains against connectors 12 to prevent downward movement, while spring fingers 80 are still upright following passage of the assembly 26.

FIG. 8 represents several movements beyond FIG. 7. First, the cylinder 69 has moved loading bar 69 against the upper end of tray 2 to shift second end 5 thereof toward delivery station 86 and into mating engagement with leading edge 94 of surface 88, the flange 9 surrounding the bottom of tray 2 catching under edge 94, as will be described (FIGS. 10 and 10A). Note also that pickup plate 30 is nested in the bottom of tray 2, and the loading bar 68 is against the top of flange 9 to prevent it fromm popping up. Second, cylinder 83 has pivoted lever 81 about shaft 82 so that spring fingers 80 are loaded against the bottom connector 12 in each row on tray 2. Third, the holding bar 54 has been moved upward by the action of cylinders 56. The next movement is the release of fingers 80, which permits connectors 12 to slide downward to delivery station 86. When sufficient connectors have been removed from the lower end of delivery station 86 to empty the tray, this is detected by opto-electronic through-beam sensor assembly 93 and the stop 48 is moved to permit downward pivoting of assembly 26 as shown in FIG. 3.

FIG. 9 depicts either stop 44 or 48; pneumatic cylinders 45, 49 are used to pivot the L-shaped arms 46, 50 into and out of the path of base plate 28 simultaneously in opposite directions.

FIG. 10 shows the leading end 94 of inclined surface 88, which comprises channels 91 separated by ridges 92, which ridges have extensions or fingers extending beyond edge 94.

FIG. 10A is a partial perspective of a tray 2. Each tray has an upper surface 3 bounded by a first end (not shown), an opposed open second end 5, and lateral sidewalls 6. The surface 3 is interrupted by channels 7 separated by ridges 8. Each channel has a pair of shoulders 11 therein on which the connector bodies ride; the leads extend freely into the channels 7 and are thus protected from damage. The tray 2 is vacuum formed from a single sheet of plastic and thus has a recessed bottom surface which generally conforms with top surface 3. A flange 9 surrounding the body of the tray serves to strengthen it and is useful for mating with the delivery station.

FIG. 10B shows the tray 2 mated to the leading edge 94 of the upper inclined surface 88 of the delivery station. The fingers 95 extending from ridges 92 fit into channels 7 in tray 2 contacting the bottom surfaces of the tray channels to correct for any warpage that may exist in the trays, the flange 9 fitting under the slanted sections of the fingers 95. Connectors 12 riding on shoulders 11 (FIG. 10A) slide by gravity onto ridges 92; the leads 13 thus straddle the ridges 92 and extend into adjacent channels 91. A flat piece 10 which may simply be cardboard is press-fit in the recessed bottom of the tray to facilitate nesting with a tray below, and to provide strength and stability to each tray.

FIG. 11 is an end view of the delivery station 86 with connector end stop and sensor assembly removed. The cover 97 obscures most of the delivery surface between the upper inclined surface 88 and the lower horizontal surface 89. Individual spring fingers 80 on shaft 82, and operated by cylinder 83 through lever 81 fixed to said shaft, align with connectors (not shown) which are fed down onto the ridges 92.

FIG. 12 details the lower carriage 36 (FIGS. 1, 2 and 3) which shifts to pivot the pickup assembly down to the dump position (FIG. 3). The carriage has four pairs of grooved wheels 37, one pair on each side of each track 38, whereby the carriage 36 is positively limited to rectilinear movement. The carriage 36 is driven by air admitted into stainless steel cylinder 42, which has a piston therein magnetically coupled to the yoke 40. The tracks 38 and cylinder 42 are fixed to lower cross member 21 of frame 16.

Proximity switches are provided on, but are not limited to, cylinders 75, 66, 45, 49, 83, 40 to 42, and on base plate 28 of assembly 26 at the tray pickup position to provide interlock for controls that will prevent certain actions to occur out of sequence.

The foregoing is exemplary and not intended to limit the scope of the claims which follow.

We claim:

1. Apparatus for providing a continuous supply of workpieces to a pickup station, said workpieces being packaged in trays, each tray having a top surface bounded by a first end and an opposed open second end, said workpieces being in side-by-side rows on said top surface, each row having a plurality of workpieces aligned end-to-end, said apparatus comprising:

a frame having opposed first and second vertical ends;

a magazine in the top of said frame where trays are stacked, each tray being generally horizontal, the first end of each tray being proximate the first vertical end of said frame, the open second end of each tray being proximate vertical second end of said frame, a pickup plate assembly having a first end and an opposed second end, said first end being pivoted at said first end of said frame proximate the bottom of said magazine, said assembly being pivotable from a generally horizontal pickup position paralleling the bottom of said magazine to an inclined delivery position;

a delivery station having a generally planar inclined surface which is substantially coplanar with the top surface of a tray and substantially contiguous with the open second end thereof when said pickup plate is in the inclined delivery position with a tray thereon.

2. Apparatus as in claim 1 wherein said pickup plate assembly comprises a pickup plate and a generally parallel base plate, said base plate being pivoted in said first end of said frame, said pickup plate being movable vertically from a lower to an upper position relative to said base plate, when said assembly is horizontal, to lift the stack of trays in said magazine, said frame having mounted therein release means which hold said stack before lifting, said release means being positioned to hold only the trays above the lowest tray in the stack when said pickup plate is in the lower position.

3. Apparatus as in claim 1 wherein said pickup plate assembly comprises a pickup plate profiled to receive a tray therein, said tray having a recessed bottom surface which receives said pickup plate therein.

4. Apparatus as in claim 1 wherein said pickup plate assembly comprises releasable holding means toward the second end thereof, said holding means being effective to prevent downward movement of said workpieces when said assembly is pivoted downward from the horizontal position.

5. Apparatus as in claim 1 or claim 4 further comprising releasable spring-loaded down-down means associated with said frame, said means being effective to prevent downward movement of said workpieces when said assembly is in the inclined delivery position with a tray thereon.

6. Apparatus as in claim 1 wherein said delivery station is adapted to receive workpieces from a tray having channels therein, said channels being profiled to carry respective rows of card edge electrical connectors or the like end-to-end therein, said connectors or the like each having two rows of parallel leads extending into the respective channel, said inclined surface having rows of channels therein separated by ridges, said ridges aligning with channels in the tray when the assembly is in the delivery position with a tray thereon, whereby electrical connectors are received on the ridges with one row of leads extending into each adjacent channel in the inclined surface.

7. Apparatus as in claim 6 wherein said ridges have respective fingers extending toward the channels in the tray when the assembly is in the inclined delivery position.

8. Apparatus as in claim 7 wherein said assembly further comprises means for moving said tray toward said inclined surface when the assembly is in the delivery position, whereby the tray may be moved toward the inclined surface until the fingers are received in respective channels in the tray.

9. Apparatus as in claim 1 wherein said pickup plate assembly is pivotable from the inclined delivery position further downward from the pickup position to a dumping position whereby an empty tray may be dumped.

* * * * *